US006888133B2

(12) United States Patent
Wells et al.

(10) Patent No.: US 6,888,133 B2
(45) Date of Patent: May 3, 2005

(54) INTEGRATED ION FOCUSING AND GATING OPTICS FOR ION TRAP MASS SPECTROMETER

(75) Inventors: Gregory J. Wells, Fairfield, CA (US); Steven D. Schachterle, Martinez, CA (US)

(73) Assignee: Varian, Inc., Palo Alto, CA (US)

( * ) Notice: Subject to any disclaimer, the term of this patent is extended or adjusted under 35 U.S.C. 154(b) by 282 days.

(21) Appl. No.: 10/066,124

(22) Filed: Jan. 30, 2002

(65) Prior Publication Data

US 2003/0141449 A1 Jul. 31, 2003

(51) Int. Cl.$^7$ ................................................ H01J 49/42
(52) U.S. Cl. .................... 250/292; 250/282; 250/396 R; 250/294
(58) Field of Search ................................ 250/292, 282, 250/396 R, 294, 281

(56) References Cited

U.S. PATENT DOCUMENTS

| | | | |
|---|---|---|---|
| 4,924,089 A | | 5/1990 | Caravatti |
| 5,576,540 A | * | 11/1996 | Jolliffe ........................ 250/292 |
| 5,750,993 A | | 5/1998 | Bier |
| 6,005,245 A | | 12/1999 | Sakairi et al. |
| 6,259,091 B1 | * | 7/2001 | Eiden et al. ................. 250/281 |
| 6,570,153 B1 | * | 5/2003 | Li et al. ...................... 250/292 |
| 2002/0121594 A1 | * | 9/2002 | Wang et al. ................. 250/281 |

FOREIGN PATENT DOCUMENTS

WO    WO 98/02901    1/1998

OTHER PUBLICATIONS

Van Berkel et al., "Electrospray Ionization Combined with Ion Trap Mass Spectrometry" published by Analytical Chemistry, American Chemical Society, Columbus, vol. 62, No. 13, Jul. 1, 1990, pp. 1284–1295.

Padley et al., "Quantification of Biomolecules by External Electrospray Ionization Fourier Transform Mass Spectrometry" published by Analytical Chemistry, American Chemical Society, Columbus, vol. 60, No. 15, Aug. 1, 1997, pp. 2914–2918.

Dahl et al., "A Modular IOn Beam Deflector" published by International Journal of Mass Spectrometer, Elsevier Science Publishers, Amsterdam, NL, vol. 189, No. 1, Jul. 8, 1999, pp. 47–51.

Szilagyi et al., "Synthesis of Electrostatic Focusing and Deflection Systems" published by Journal of Vacuum Science and Technology; vol. 15, No. 6, Nov. 1997, pp. 1971–1982.

Dowler et al., "Aberrations of an Electrostatic Three–Cylinder System Used to Simultaneously Focus and Deflect Charged Particles" published by Nuclear Instruments & Methods in Physics Research, Section A, vol. A363, No. 1, 1995, pp. 54–58.

Louris et al., "Injection of Ions Into a Quadrupole Ion Trap Mass Spectrometer" published by International Journal of Mass Spectrometry and Ion Processes, vol. 88, No. 2/3 index, Apr. 1, 1989, pp. 97–111.

* cited by examiner

*Primary Examiner*—John R. Lee
*Assistant Examiner*—Phillip A Johnston
(74) *Attorney, Agent, or Firm*—Bella Fishman; David Gloekler

(57) ABSTRACT

An integrated ion focusing and gating lens for use in an ion trap mass spectrometer includes first and second members of combined generally cylindrical configuration with the members focusing an ion beam along an axis of the generally cylindrical configuration when biased with the same voltage on each member, and the members deflecting an ion beam when the members are biased with different voltages. In a preferred embodiment, the first and second members are identical in configuration.

10 Claims, 9 Drawing Sheets

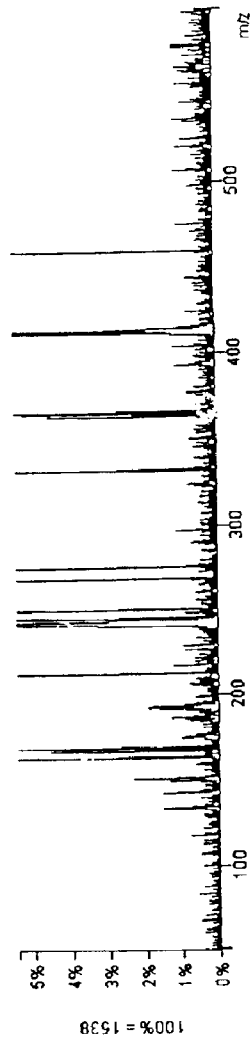
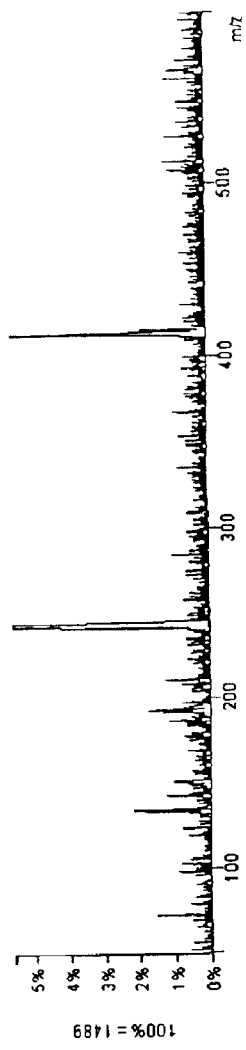

INTEGRATED ION FOCUSING AND GATING OPTICS FOR ION TRAP MASS SPECTROMETER

BACKGROUND OF THE INVENTION

This invention relates generally to ion trap mass spectrometers, and more particularly the invention relates to ion focusing and gating optics for use in an ion trap mass spectrometer.

Atmospheric pressure ionization sources are coupled to mass spectrometers with ion optic assemblies. Ions formed in an atmospheric pressure ionization source are passed through a sampling orifice into a vacuum chamber and then through a beam skimmer into a quadrupole, hexapole or octopole ion guide and transported to an exit lens having a small aperture. Ions passing through the exit lens pass through a second ion optics stage including an ion guide focus lens and end cap lens which cooperatively function to direct the ion beam into the entrance hole of the ion trap end cap. The ion trap selects ions for passage on to an ion detector.

Electrospray ionization occurs at atmospheric pressure and produces charged droplets having a wide distribution of droplet diameters. The largest of these droplets are removed by applying a flow of heated gas that flows away from the entrance orifice into the vacuum chamber. When the droplets are large, the gas flow is sufficient to transport the droplets away from the orifice against the attractive force of an electric field existing between the spray source and the entrance orifice. Droplets that are very small are evaporated by the heated gas to produce charged sample ions that are easily attracted by the electric field to the entrance orifice, moving counter to the flow of gas. Droplets of intermediate size are also attracted by the electric field into the orifice and thereby into the vacuum chamber. The ions exit the orifice, or vacuum restriction that limits the gas load on the vacuum pumps, moving almost at the velocity of the expanding gas, which is supersonic. Hence the kinetic energy of droplets moving at nearly the same velocity as the gas will have very high kinetic energies due to the large mass of the droplets. It is undesirable to allow these charged droplets to enter the trap when the trapped ions are being scanned out for detection. The droplets will cause large noise spikes that obscure the spectrum. This problem becomes greater at larger liquid flow rates into the electrospray. Prior art devices have used one of the focusing electrodes as a gate to stop ions from entering the trap during the scanning process by applying a large repulsive potential to stop the ions from passing through the lens. See U.S. Pat. No. 5,750,993 for example. However, this requires the charged droplets to stop and reverse direction to avoid entering the end cap hole which creates background noise in the detector.

The present invention is directed to reducing background noise from charged droplets.

SUMMARY OF THE INVENTION

In accordance with the invention, a combined ion focusing and gating optics is provided for coupling ion flow from an ion guide to an ion trap in a mass spectrometer. The ion focusing and gating optics includes a split generally cylindrical ion optic deflector lens element which serves as a focus lens in focusing an ion beam into the entrance hole or aperture in the ion trap end cap.

When it is desirable to fill the ion trap with ions, the voltage applied to the two halves of the deflector lens are identical, and the lens functions as a focusing lens. When it is desired to prevent ions from entering the entrance hole of the end cap, the two halves of the lens are set at large potentials with opposite polarities. Thus, ions are deflected off from the axis of symmetry or axis of focus and away from the entrance hole. By gating ions with the split deflector lens, background noise in a detected spectrum is reduced.

The features of the invention will be more readily apparent from the following detailed description and appended claims when taken with the drawings.

BRIEF DESCRIPTION OF THE DRAWINGS

FIGS. 5A, 5B illustrate the mass spectrum when using an ion guide exit lens to stop ions and when using the deflector lens in accordance with the invention, respectively.

DETAILED DESCRIPTION OF THE INVENTION

Figure 1:
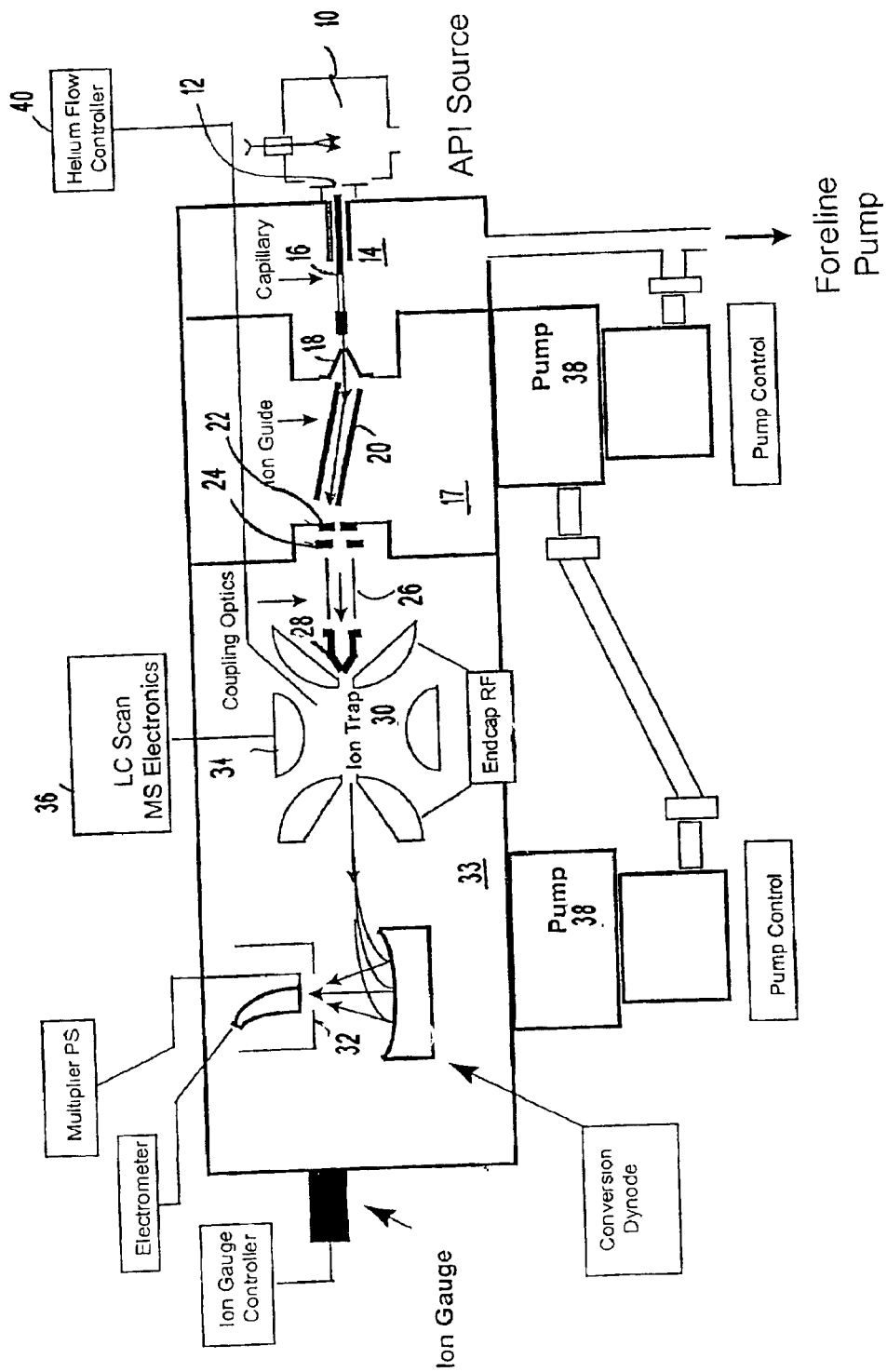
FIG. 1 is a schematic diagram of an ion trap MS/MS mass spectrometer in which the present invention is used.

FIG. 1 is a simplified schematic diagram of an ion trap mass spectrometer in which the ion focusing and gating optics of the present invention are employed. Briefly, electrospray ionization occurs in atmospheric pressure ionization source 10 which produces charged droplets having a wide distribution of droplet diameters. As described above, the largest of these droplets are removed by applying a flow of heated gas that flows away from the entrance orifice 12 into a vacuum chamber 14 at 1–2 Torr pressure. When the droplets are large, the gas flow is sufficient to transport the droplets away from the orifice against the attractive force of an electric field existing between the source 10 and the entrance orifice 12. Droplets that are very small are evaporated by heated gas to produce charged sample ions that are easily attracted by the electric field to the entrance orifice and through capillary 16 to vacuum chamber 14. Ions move through a skimmer 18 into a hexapole ion guide 20 within a second chamber 17 at 8 mTorr. Ion guide 20 directs the ions to an ion guide exit 22 and to an ion guide focus lens 24 and deflector lens 26 to an aperture in end cap 28 of the ion trap 30. Ions from ion trap 30 are subsequently detected by a detector 32 which along with vacuum chamber 33 is maintained at 30 µTorr pressure. A hyperbolic ring 34 of the ion trap is energized by a 760 kHz RF source 36, and the vacuum within the mass spectrometer is maintained by pumps 38 and a foreline pump (not shown). As is conventional, an inert gas atmosphere such as helium is provided in the ion trap 30 by helium flow controller 40.

Figure 2:
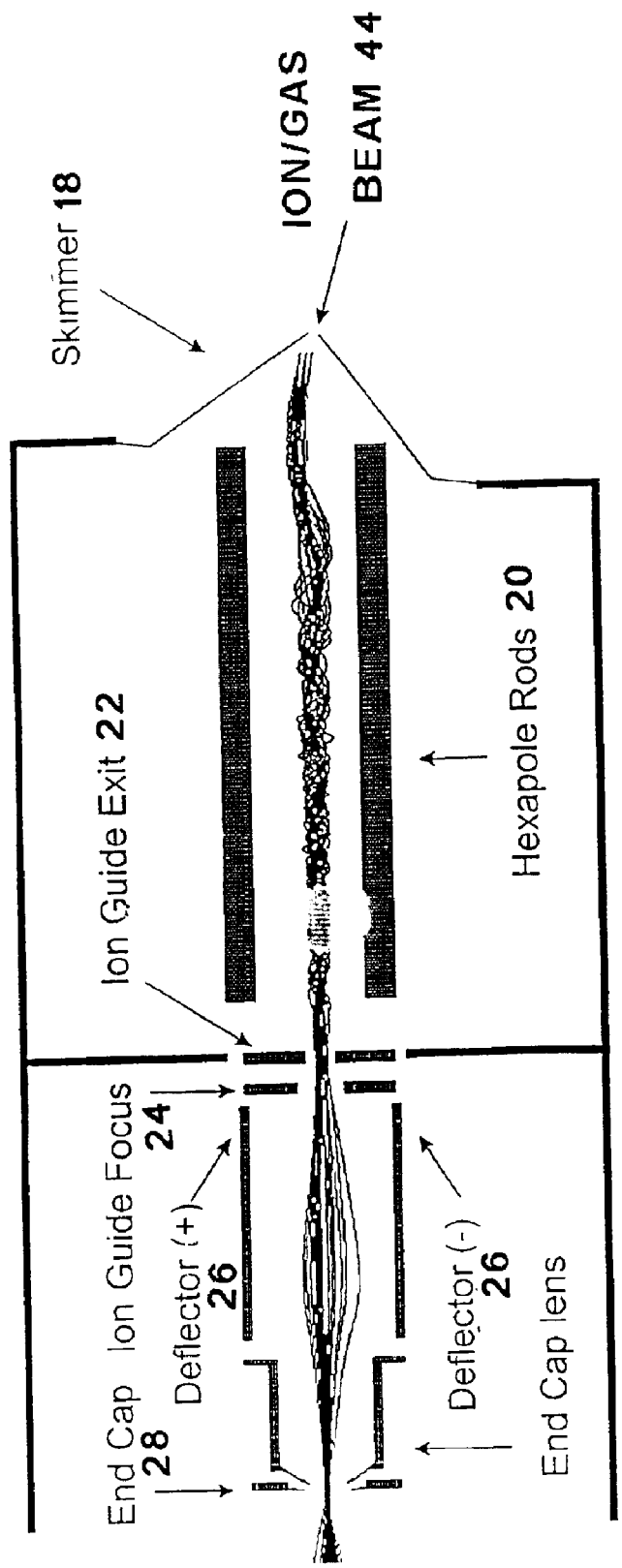
FIG. 2 illustrates a hexapole rod ion guide, ion guide focus lens, deflector lens, and end cap lens which together focus an ion beam into the entrance hole of an ion trap end cap in accordance with an embodiment of the present invention.

FIG. 2 is a view of hexapole ion guide 20 which receives ion beam 44 through skimmer 18 and directs the ion beam through ion guide exit 22 and ion guide focus lens 24 to deflector lens 26 and thereafter to an aperture in end cap 28 of the ion trap.

Figure 3:
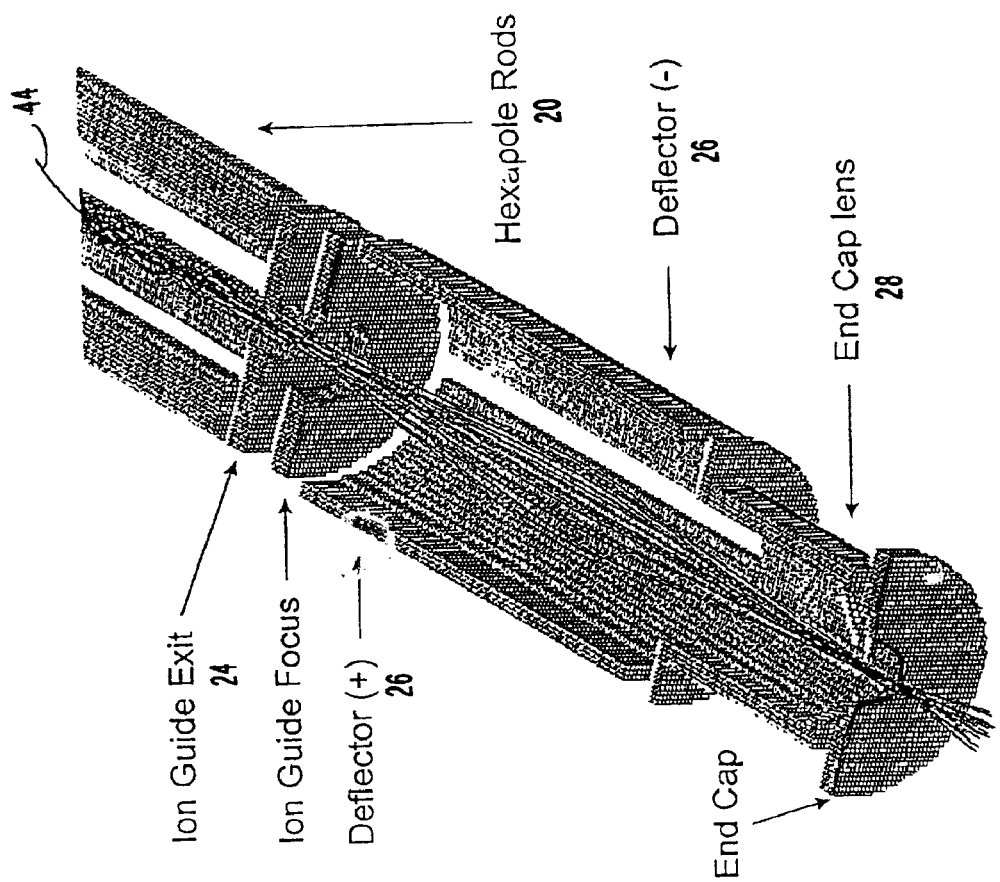
FIG. 3 is a perspective view of one half of the deflector lens of FIG. 2.

FIG. 3 is a perspective view illustrating the bottom portions of the two deflector members in the lens 26. Unlike the prior art which biases the ion guide exit 22 or ion guide focus lens 24 to terminate the flow of ion and gas beam 44, in accordance with the invention the two halves of the generally cylindrical deflector lens 26 is voltage biased to deflect the ion and gas beam 44 away from the aperture in end cap 28.

Figure 4:
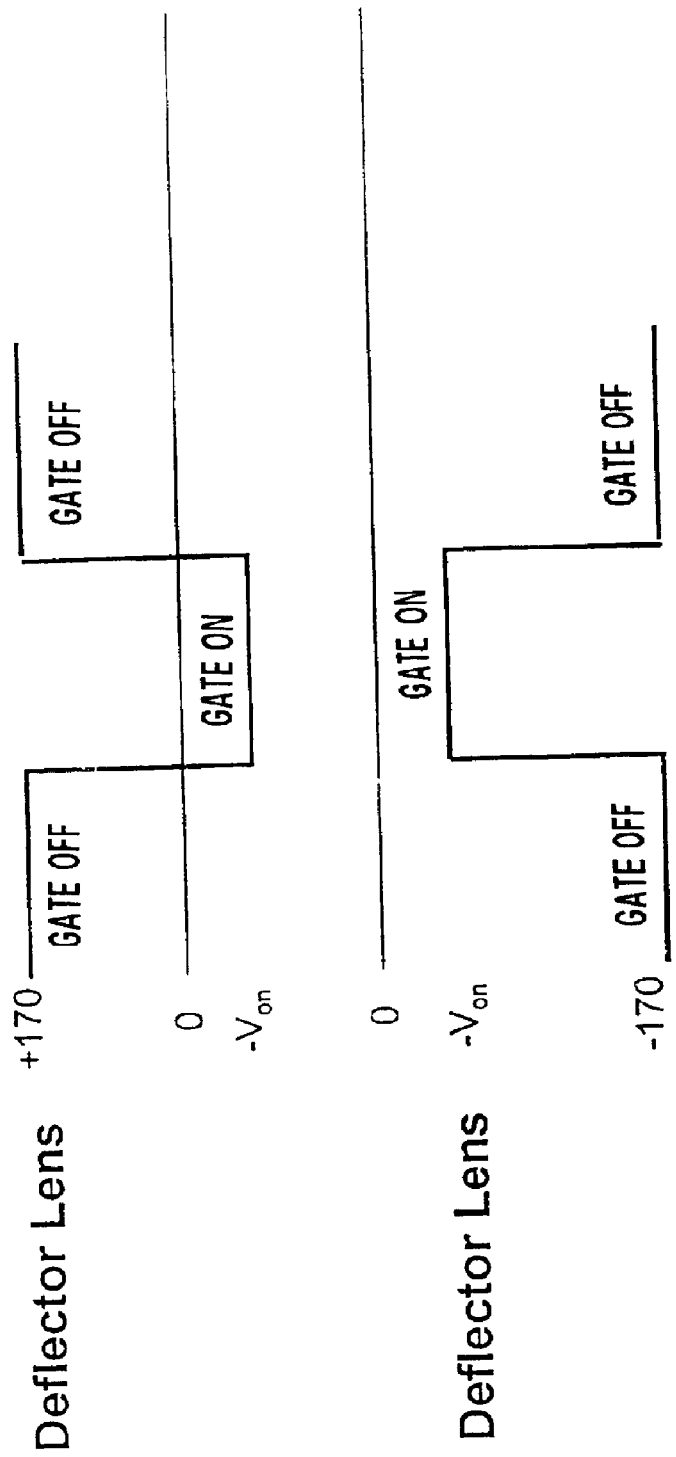
FIG. 4 illustrates voltages applied to the deflector lens for passing ions and for deflecting ions, respectively.

The operation of the deflector lens is illustrated with the voltage wave forms of FIG. 4. When the two halves of deflector lens 26 are of opposite polarity (e.g., +170 volt, −170 volt) the deflector member turns off the ion beam by deflection. When the deflector lens passes ions to end cap 28, both halves of the deflector lens are at the same low voltage as illustrated in FIG. 4.

FIGS. 5A, 5B compare a spectrum with two sample ions of mass to charge ratios of 242 and 410. No heated gas is used in this example and the liquid flow rate is only 5 µ/min. FIG. 5A shows the baseline of the spectrum when the ion guide exit lens is used as a gate electrode to stop ions from entering the trap during a scan. FIG. 5B illustrates the results of applying the gating voltage to the split lens of the deflector lens 26. Droplet noise spikes were eliminated and the sample ions are now clearly discernable.

Figure 6A:
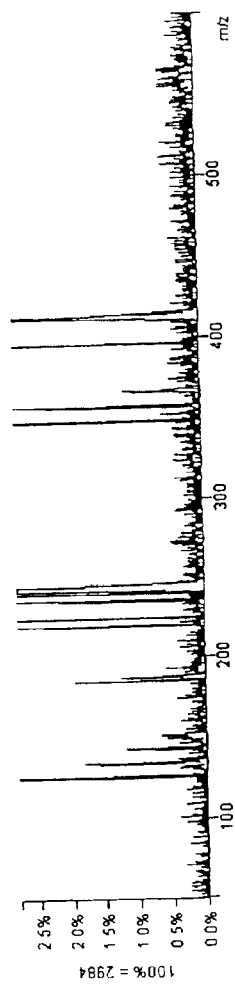
FIGS. 6A, 6B illustrate the background noise in an ion spectrum and the effect of a gas flow against ion droplet flow.
Figure 6B:
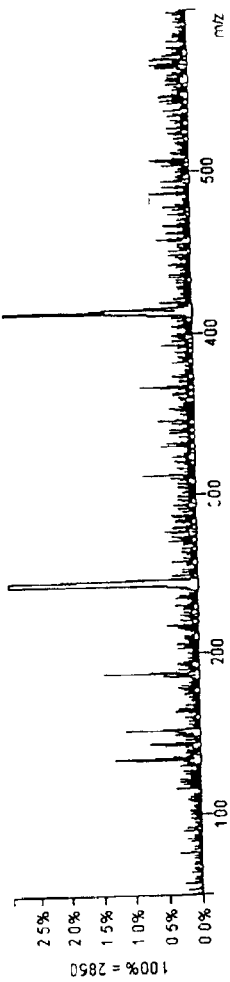

FIGS. 6A, 6B compare the effect of having 2 l/min of gas flowing against the ion/droplet flow. Although the gas flow reduces spike noise when using the exit lens as a gate, it does not totally eliminate it.

Figure 7:
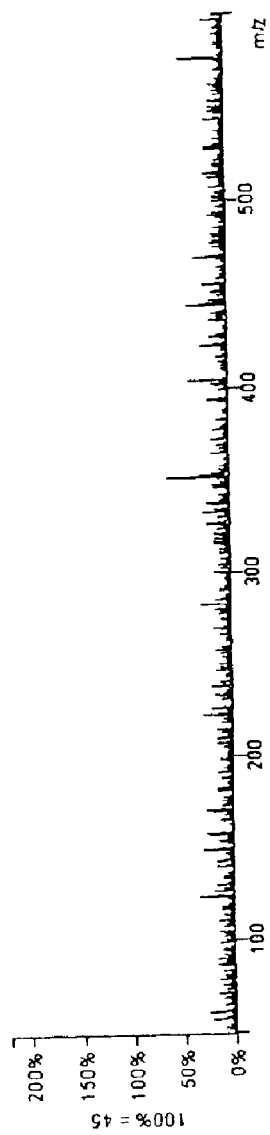
FIG. 7 illustrates normal electronics background noise when no liquid is flowing in a mass spectrometer.

FIG. 7 illustrates normal electronic background when no liquid is flowing for comparison.

Figure 8A:
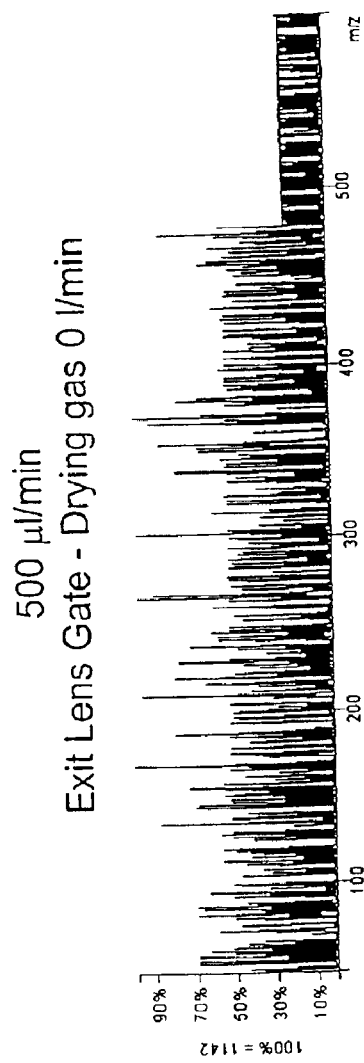
FIGS. 8A, 8B illustrate spectrum without gas using the exit lens gate and the deflector lens gate, respectively.
Figure 8B:
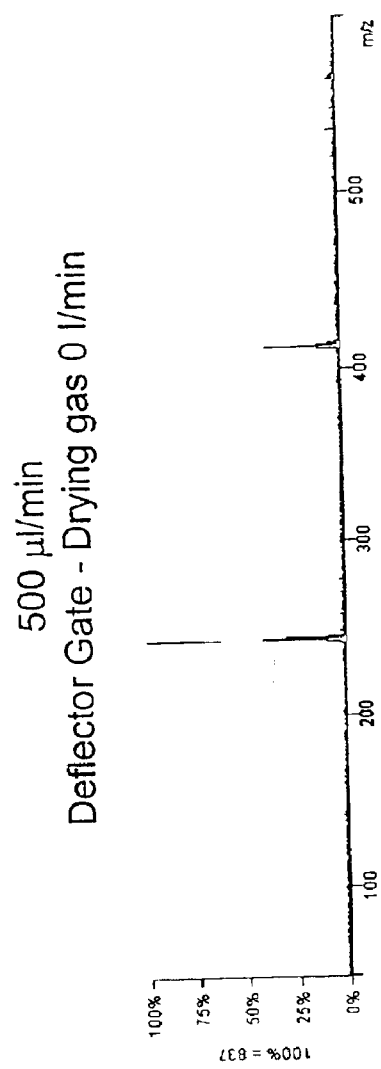

FIGS. 8A, 8B compare spectrum without gas but at a liquid flow rate of 500 µ/min. into the electrospray, where the exit lens (FIG. 8A) and deflector (FIG. 8B) are used as a gate.

Figure 9A:
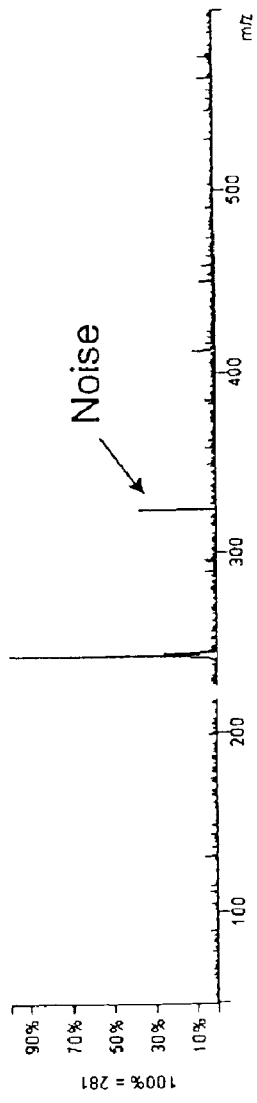
FIGS. 9A, 9B compare ion spectrum with gas flow using the exit lens gate and the deflector gate, respectively.
Figure 9B:
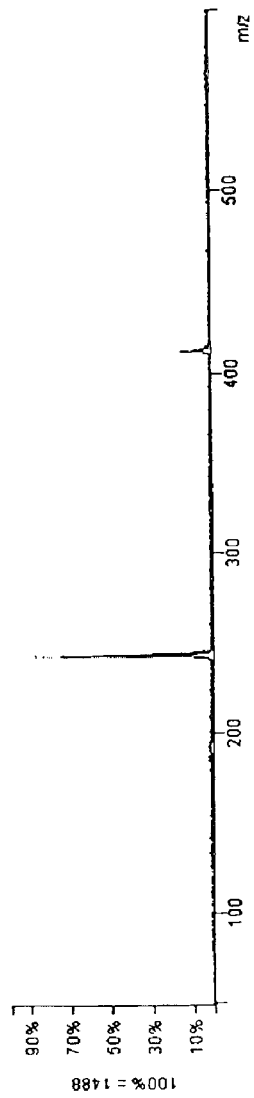

FIGS. 9A, 9B compare the detected mass spectrum obtained with 11 l/min of gas and gating with the exit lens versus using 2 l/min and the split deflector lens. It will be noted that in FIG. 9A the noise is considerably reduced due to the high gas flow rate, but at the expense of significantly reduced sensitivity. These figures demonstrate the effectiveness of deflecting ions away from the entrance hole in the ion trap end cap versus stopping and reversing ions by means of a repelling voltage applied to one of the focusing lenses as in the prior art.

There has been described an integrated ion focusing and gating optics lens for use in an ion trap mass spectrometer to reduce background noise of detected ion spectrum. While the invention has been described with reference to specific embodiments, the description is illustrative of the invention and is not to be construed as limiting the invention. Various modifications and changes may occur to those skilled in the art without departing from the true spirit and scope of the invention as defined by the appended claims.

What is claimed is:

1. In an ion trap mass spectrometer, apparatus for directing ions from a source to the ion trap comprising:
   a) an ion guide including multipole rods and an ion guide exit for receiving an ion beam from the source and directing the ion beam through the ion guide exit;
   b) an ion guide focus lens having an aperture for receiving the ion beam when voltage biased;
   c) a deflector lens including first and second members forming of generally cylindrical configuration, said members focusing ion flow along an axis of the generally cylindrical configuration when biased with the same voltage on each member, and said members deflecting an ion flow when biased with respective voltages of opposite polarities; and
   d) an ion trap end cap lens having an aperture for receiving an ion beam from the deflector lens for the ion trap.

2. Apparatus as defined by claim 1, wherein the first and second members are identical in configuration.

3. Apparatus as defined by claim 2, further comprising a vacuum pump for maintaining evacuated atmospheres in the ion guide and in the deflector lens.

4. An ion trap mass spectrometer comprising:
   a) an atmospheric pressure ion source;
   b) an ion guide for receiving an ion beam from the ion source;
   c) a deflector lens having first and second members of generally cylindrical configuration, said members focusing ion flow along an axis of the generally cylindrical configuration when biased with the same voltage on each member, and said members deflecting an ion flow when said members are biased with respective voltages of opposite polarities; and
   d) an ion trap including an end cap having an aperture for receiving the ion beam from the deflector lens.

5. The ion trap mass spectrometer as defined by claim 4, further comprising a vacuum pump for maintaining evacuated atmospheres in the ion guide and in the deflector lens.

6. The ion trap mass spectrometer as defined by claim 5, wherein the first and second members of the deflector lens are identical in configuration.

7. The ion trap mass spectrometer as defined by claim 6, wherein the ion guide includes multipole rods and an ion exit guide.

8. The ion trap mass spectrometer as defined by claim 7, further comprising an ion guide focus lens having an aperture for receiving an ion beam from the ion guide exit.

9. The ion trap mass spectrometer as defined by claim 8, further comprising an ion detector for receiving and detecting the mass of ions from the ion trap.

10. The ion trap mass spectrometer as defined by claim 4, further comprising an ion detector for receiving and detecting the mass of ions from the ion trap.

* * * * *